United States Patent
Wu et al.

(10) Patent No.: US 9,607,989 B2
(45) Date of Patent: Mar. 28, 2017

(54) FORMING SELF-ALIGNED NISI PLACEMENT WITH IMPROVED PERFORMANCE AND YIELD

(71) Applicant: GLOBALFOUNDRIES Inc., Grand Cayman (KY)

(72) Inventors: Xusheng Wu, Ballston Lake, NY (US); Yue Hu, Mechanicville, NY (US); Xin Wang, Clifton Park, NY (US); Yong Meng Lee, Mechanicville, NY (US); Wen-Pin Peng, Clifton Park, NY (US); Lun Zhao, Ballston Lake, NY (US); Wei-Hua Tong, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/560,049

(22) Filed: Dec. 4, 2014

(65) Prior Publication Data

US 2016/0163702 A1     Jun. 9, 2016

(51) Int. Cl.
*H01L 27/092* (2006.01)
*H01L 29/165* (2006.01)
(Continued)

(52) U.S. Cl.
CPC .... *H01L 27/0922* (2013.01); *H01L 21/02532* (2013.01); *H01L 21/28518* (2013.01);
(Continued)

(58) Field of Classification Search
CPC .......... H01L 27/0922; H01L 21/02532; H01L 21/28518; H01L 21/31116;
(Continued)

(56) References Cited

U.S. PATENT DOCUMENTS 7,202,132 B2 * 4/2007 Zhu ..................... H01L 29/1054
257/377
8,288,825 B2 * 10/2012 Chong ............ H01L 21/823807
257/369

(Continued)

OTHER PUBLICATIONS

Byron Ho, Segmented-Channel Si1-xGex/Si pMOSFET for Improved ION and Reduced Variability, Mar. 2013, University of California at Berkeley, Applied Materials, Inc. Soitec, Slide 9.*

*Primary Examiner* — Marc Armand
*Assistant Examiner* — Shannon Yi
(74) *Attorney, Agent, or Firm* — Ditthavong & Steiner, P.C.

(57) ABSTRACT

Methods for forming a trench silicide without gouging the silicon source/drain regions and the resulting devices are disclosed. Embodiments include forming first and second dummy gates, each with spacers at opposite sides thereof, on a substrate; forming eSiGe source/drain regions at opposite sides of the first dummy gate; forming raised source/drain regions at opposite sides of the second dummy gate; forming a silicon cap on each of the eSiGe and raised source/drain regions; forming an ILD over and between the first and second dummy gates; replacing the first and second dummy gates with first and second HKMG, respectively; forming a contact trench through the ILD into the silicon cap over each of the eSiGe and raised source/drain regions; and forming a silicide over the eSiGe and raised source/drain regions.

18 Claims, 10 Drawing Sheets

(51) Int. Cl.
*H01L 29/78* (2006.01)
*H01L 29/45* (2006.01)
*H01L 29/417* (2006.01)
*H01L 29/08* (2006.01)
*H01L 21/8238* (2006.01)
*H01L 29/66* (2006.01)
*H01L 21/02* (2006.01)
*H01L 21/311* (2006.01)
*H01L 21/285* (2006.01)
*H01L 29/06* (2006.01)
*H01L 21/768* (2006.01)

(52) U.S. Cl.
CPC .. *H01L 21/28525* (2013.01); *H01L 21/31116* (2013.01); *H01L 21/76897* (2013.01); *H01L 21/823814* (2013.01); *H01L 27/092* (2013.01); *H01L 29/0653* (2013.01); *H01L 29/0847* (2013.01); *H01L 29/165* (2013.01); *H01L 29/41783* (2013.01); *H01L 29/45* (2013.01); *H01L 29/665* (2013.01); *H01L 29/66545* (2013.01); *H01L 29/7848* (2013.01); *H01L 21/76805* (2013.01); *H01L 21/76843* (2013.01); *H01L 21/76855* (2013.01); *H01L 21/823828* (2013.01)

(58) Field of Classification Search
CPC ..... H01L 21/823814; H01L 21/823828; H01L 29/0653; H01L 29/0847; H01L 29/165; H01L 29/41783; H01L 29/45; H01L 29/665; H01L 29/66545; H01L 29/7848
See application file for complete search history.

(56) References Cited

U.S. PATENT DOCUMENTS

| | | | |
|---|---|---|---|
| 9,093,303 B2* | 7/2015 | Lii | H01L 27/092 |
| 2008/0224232 A1* | 9/2008 | Hsieh | H01L 21/28097 |
| | | | 257/384 |
| 2010/0078728 A1* | 4/2010 | Li | H01L 21/823425 |
| | | | 257/369 |
| 2013/0012009 A1* | 1/2013 | Cheng | H01L 21/823842 |
| | | | 438/585 |
| 2013/0146953 A1* | 6/2013 | Cheng | H01L 21/84 |
| | | | 257/296 |
| 2013/0187229 A1* | 7/2013 | Cheng | H01L 29/772 |
| | | | 257/347 |
| 2013/0241004 A1* | 9/2013 | Yin | H01L 21/823807 |
| | | | 257/392 |
| 2014/0154846 A1* | 6/2014 | Cheng | H01L 29/66772 |
| | | | 438/151 |
| 2015/0325690 A1* | 11/2015 | Liu | H01L 29/78 |
| | | | 257/288 |

* cited by examiner

FORMING SELF-ALIGNED NISI PLACEMENT WITH IMPROVED PERFORMANCE AND YIELD

TECHNICAL FIELD

The present disclosure relates to fabrication of semiconductor devices with a trench silicide on the source/drain regions. The present disclosure is particularly applicable to high-k/metal gate (HKMG) semiconductor devices for the 20 nanometer (nm) technology node and beyond.

BACKGROUND

For 20 nm devices and beyond, device performance significantly relies on middle-of-the-line (MOL) processes due to contact resistance and gate to trench silicide (active area contact) capacitance issues. Due to the limited process margin with a small gate pitch, the trench silicide formation is very challenging. In particular, the trench etch is affected by embedded silicon germanium (eSiGe) and raised source/drain regions and cap oxide thickness. To insure that the trench is open, an over-etch may be used, but that generates source/drain gouging (in which the source/drain silicon is consumed). The subsequent silicide will then be formed deep into the junction area, which causes unwanted junction leakage (by diffusing horizontally) and silicide piping (by diffusing vertically along the current path and touching the junction). If the trench over-etch is reduced, the trench may not be open sufficiently to form the silicide. In both cases, yield is lost.

A need therefore exists for methodology enabling formation of trench silicide with reduced junction leakage and silicide piping, and the resulting device.

SUMMARY

An aspect of the present disclosure is a method of forming a trench silicide including forming an extra silicon cap over the source/drain regions prior to depositing the metal for the silicide.

Another aspect of the present disclosure is a device having a silicide formed from a metal and an extra silicon cap over the source/drain regions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming first and second dummy gates, each with spacers at opposite sides thereof, on a substrate; forming eSiGe source/drain regions at opposite sides of the first dummy gate; forming raised source/drain regions at opposite sides of the second dummy gate; forming a silicon cap on each of the eSiGe and raised source/drain regions; forming an interlayer dielectric (ILD) over and between the first and second dummy gates; replacing the first and second dummy gates with first and second HKMG, respectively; forming a contact trench through the ILD into the silicon cap over each of the eSiGe and raised source/drain regions; and forming a silicide over the eSiGe and raised source/drain regions.

Aspects of the present disclosure include forming second spacers at opposite sides of each of the first and second dummy gates prior to forming the silicon cap. Other aspects include forming the second spacers to a width of 1 to 20 nm. Further aspects include forming the silicon caps by epitaxially growing silicon on the eSiGe and raised source/drain regions concurrently. Additional aspects include forming the contact trench by reactive ion etching (RIE). Another aspect includes forming the silicide from nickel and the silicon cap. Further aspects include the first metal gate and eSiGe source/drain regions forming a P-type field effect transistor (PFET), and the second metal gate and raised source/drain regions forming an N-type field effect transistor (NFET).

Another aspect of the present disclosure is a method including: forming first and second dummy gates, each with spacers at opposite sides thereof, on a substrate; forming eSiGe source/drain regions at opposite sides of the first dummy gate; forming raised source/drain regions at opposite sides of the second dummy gate; forming an ILD over and between the first and second dummy gates; replacing the first and second dummy gates with first and second HKMG, respectively; forming a contact trench through the ILD into each of the eSiGe and raised source/drain regions; forming a silicon cap on each of the eSiGe and raised source/drain regions; and forming a silicide over the eSiGe and raised source/drain regions.

Aspects include forming the silicon caps by epitaxially growing silicon on the eSiGe and raised source/drain regions concurrently. Further aspects include forming the contact trench by RIE. Other aspects include forming the silicide from nickel and the silicon cap. Additional aspects include the first metal gate and eSiGe source/drain regions forming a PFET, and the second metal gate and raised source/drain regions forming an NFET.

Another aspect of the present disclosure is a device including: first and second HKMG, each with spacers at opposite sides thereof, on a substrate; eSiGe source/drain regions at opposite sides of the first HKMG; raised source/drain regions at opposite sides of the second HKMG; a silicon cap on each of the eSiGe and raised source/drain regions; an ILD over and between the first and second HKMGs; a contact trench through the ILD into the silicon cap over each of the eSiGe and raised source/drain regions; and a trench silicide over the eSiGe and raised source/drain regions.

Aspects include second spacers on the eSiGe and raised source/drain regions, between the first spacers and the silicon caps. Further aspects include the second spacers having a width of 1 to 20 nm. Other aspects include the silicon caps being formed of silicon epitaxially grown to a thickness of 1 to 20 nm. Another aspect includes the trench silicide including nickel silicide (NiSi), formed with the silicon of the silicon caps. Additional aspects include the first metal gate and the eSiGe source/drain regions forming a PFET, and the second metal gate and raised source/drain regions forming an NFET. Further aspects include shallow trench isolation (STI) regions between the eSiGe and raised source/drain regions. Other aspects include a dummy metal gate over the STI region between the eSiGe source/drain region and the raised source/drain region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of silicon gouging, which in turn causes junction leakage and silicide piping, attendant upon forming a silicide trench with an over etch to insure the trench is open. In accordance with embodiments of the present disclosure, an extra silicon cap is formed over the source/drain region to eliminate the silicon gouging and to raise the level of the silicide to reduce the problems with opening the silicide trench.

Methodology in accordance with embodiments of the present disclosure includes forming first and second dummy gates, each with spacers at opposite sides thereof, on a substrate. Then eSiGe source/drain regions are formed at opposite sides of the first dummy gate, and raised source/drain regions are formed at opposite sides of the second dummy gate. A silicon cap is formed on each of the eSiGe and raised source/drain regions. Next, an ILD is formed over and between the first and second dummy gates. The first and second dummy gates are then replaced with first and second HKMG, respectively. A contact trench is formed through the ILD into the silicon cap over each of the eSiGe and raised source/drain regions, and a silicide is formed over the eSiGe and raised source/drain regions.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 6 schematically illustrate a process flow for forming a trench silicide in accordance with an exemplary embodiment. Adverting to FIG. 1, two dummy gates 101 and 103 are formed on a substrate 105. Each dummy gate has spacers 107 formed on opposite sides and a cap 109 on top. At opposite sides of gate 101, eSiGe source/drain regions 111 are formed in the substrate. At opposite sides of gate 103, raised source/drain regions 113 of pure silicon (Si), silicon carbide (SiC), or Si and SiC with in-situ phosphorus doping are formed on the substrate. Gate 101 and source/drain regions 111 form a P-type field effect transistor (PFET) 115, and gate 103 and source/drain regions 113 form an N-type field effect transistor (NFET) 117. Electrically isolating PFETs 115 from NFETs 117 are shallow trench isolation (STI) regions 119 formed in the substrate. A dummy metal gate (not shown for illustrative convenience) is additionally formed over the STI region between eSiGe and raised source/drain regions 111 and 113, respectively.

Figure 2:
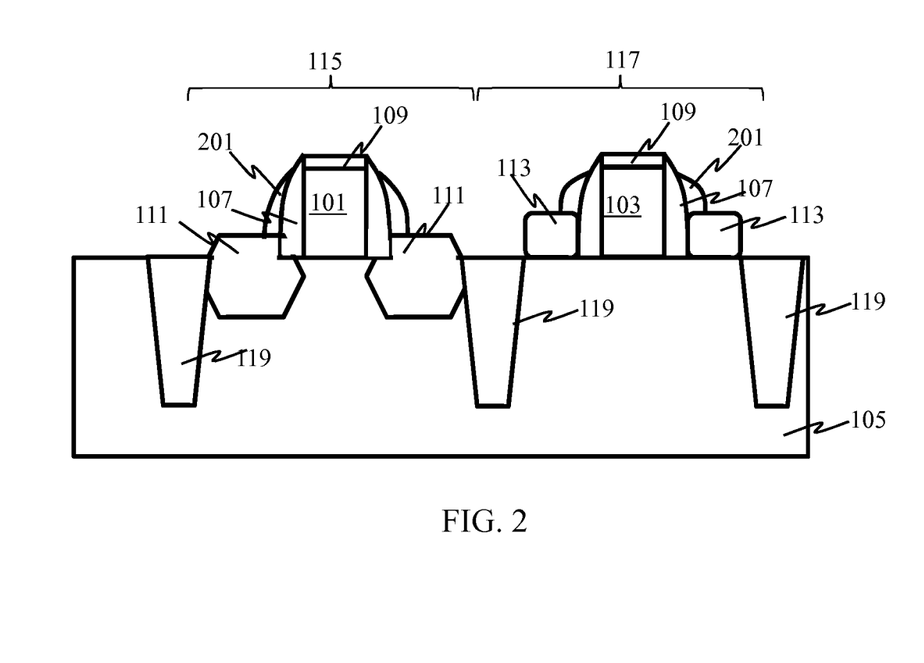
Figure 3:
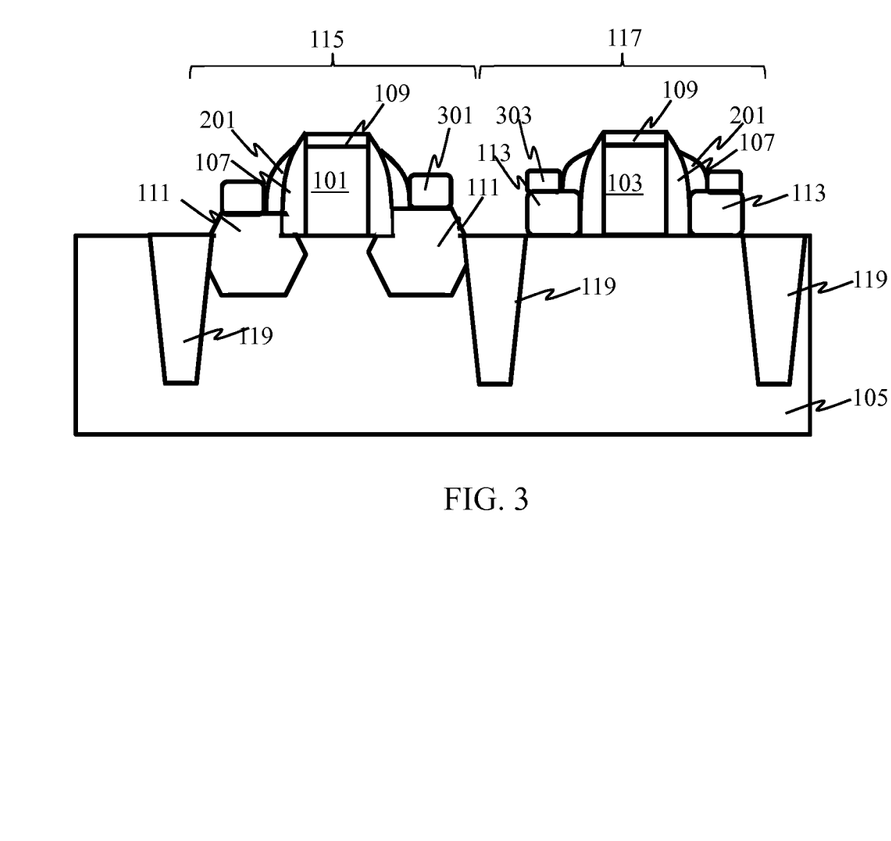

As illustrated in FIG. 2, a second set of spacers 201 are formed on spacers 107, above eSiGe source/drain regions 111 and raised source/drain regions 113. The spacers 107 may be formed to a width of 1 to 20 nm. Next, as shown in FIG. 3, an extra silicon cap 301 is grown on eSiGe source/drain regions 111, and an extra silicon cap 303 is grown on raised source/drain regions 113. Silicon caps 301 and 303 are formed by epitaxially growing an additional silicon material (the same material for both caps, grown at the same time) to the same thickness, for example to a thickness of 1 to 20 nm. The second spacers 201 increase the distance between the gates and the extra silicon caps, thereby reducing parasitic capacitances.

Figure 4:
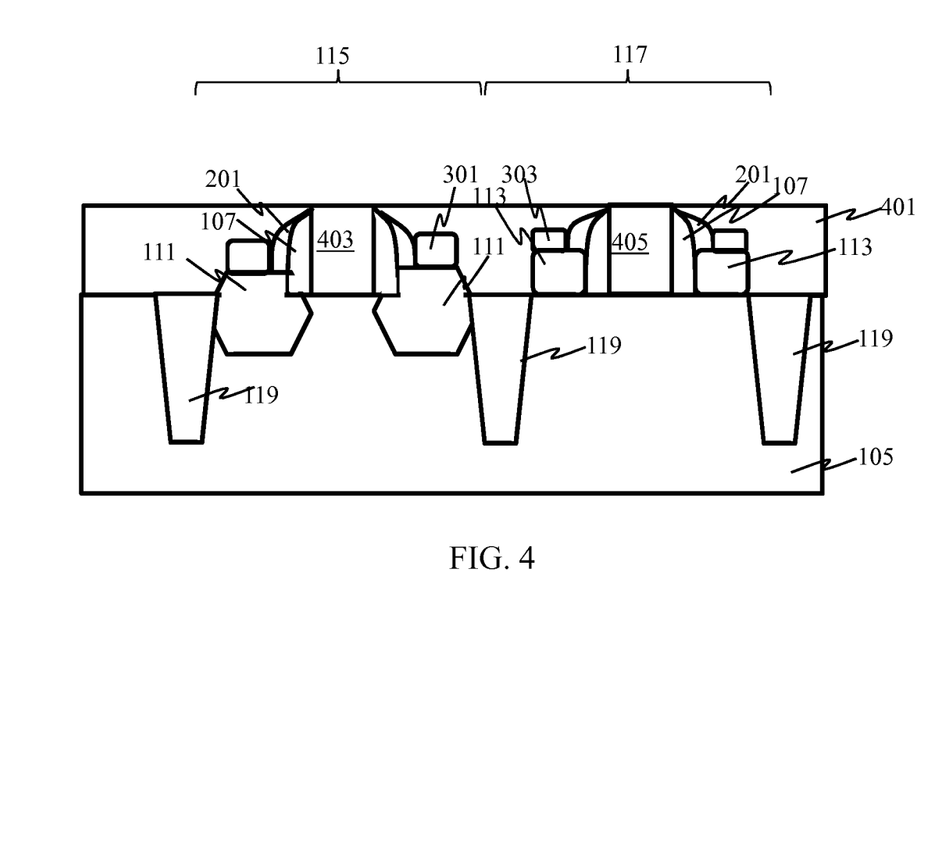

Adverting to FIG. 4, an interlayer dielectric (ILD) 401 is formed over the entire substrate and planarized (e.g. by chemical mechanical polishing (CMP)) down to caps 109, and caps 109 are removed to open up the dummy gates. Dummy gates 101 and 103 are then removed and replaced with HKMGs 403 and 405, respectively, by conventional processing. The high-k/metal gates may include a high-k dielectric layer, one or more work function metals, and metal fill (not shown for illustrative convenience).

Figure 5:
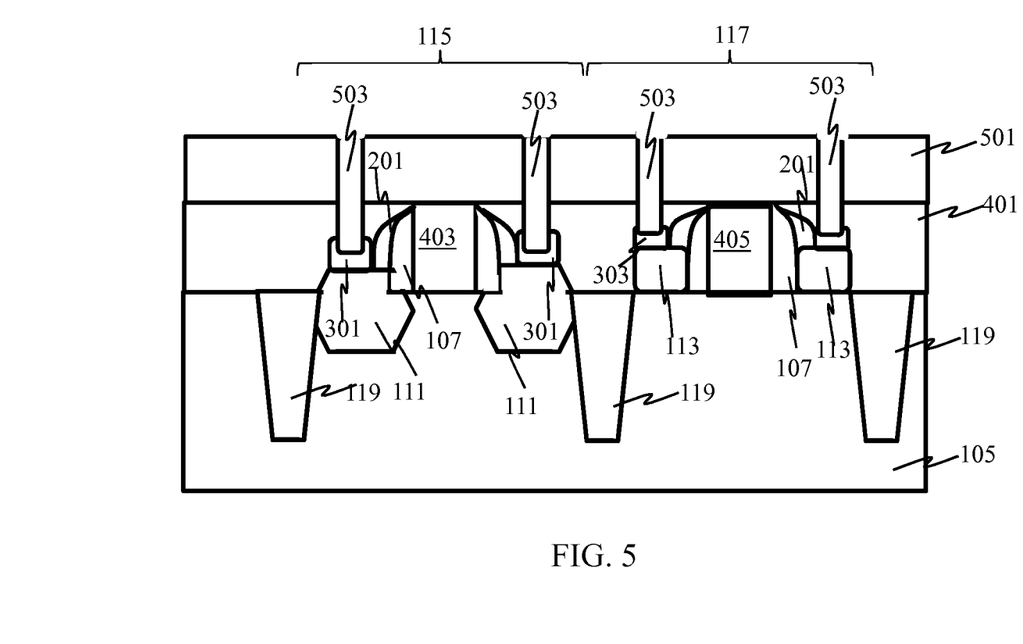
Figure 6:
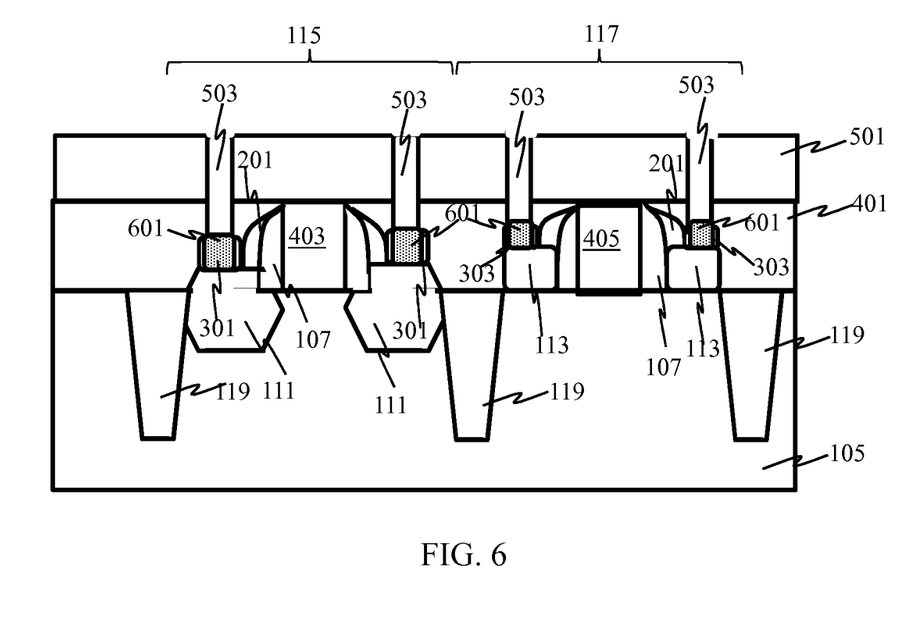
Figure 7:
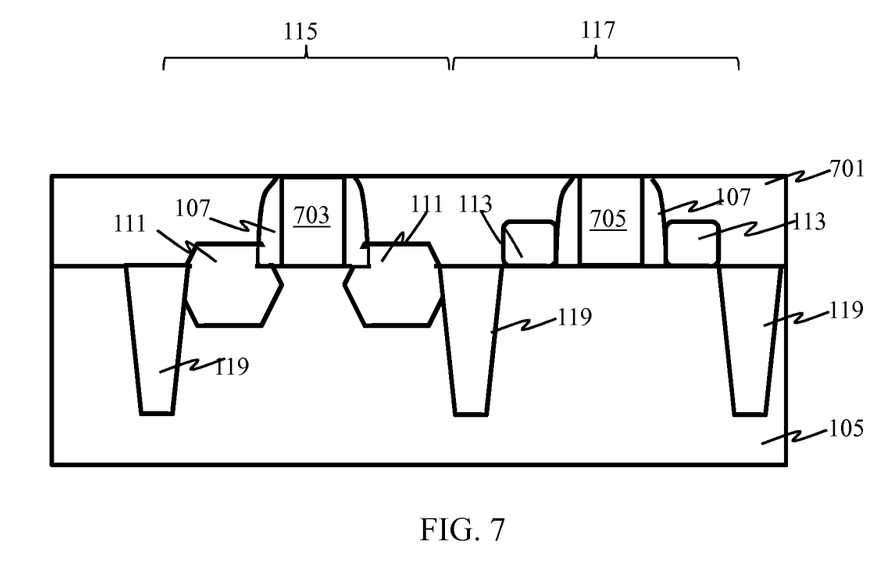
FIGS. 7 through 10 schematically illustrate a process flow for forming a trench silicide, in accordance with another exemplary embodiment.

As illustrated in FIG. 5, additional ILD 501 is formed over ILD 401, and contact trenches 503 are formed through ILDs 401 and 501, for example by RIE. The contact trenches 503 are over-etched, extending into extra silicon caps 301 and 303, but not into eSiGe and raised source/drain regions 111 and 113, respectively. A metal, such as nickel (Ni), may then be deposited in contact trenches 503 and annealed to form a silicide 601, such as nickel silicide (NiSi), as illustrated in FIG. 6. The silicide consumes the extra grown silicon caps 301 and 303, without gouging into eSiGe and raised source/drain regions 111 and 113, respectively. Accordingly, unwanted junction leakage and NiSi piping are eliminated. In addition, the silicide is self-aligned without the need for an extra mask. Subsequently, the contact trenches 503 are filled with contact material, such as tungsten (W), and conventional back-end-of-line (BEOL) processing continues (not shown for illustrative convenience).

Figure 1:
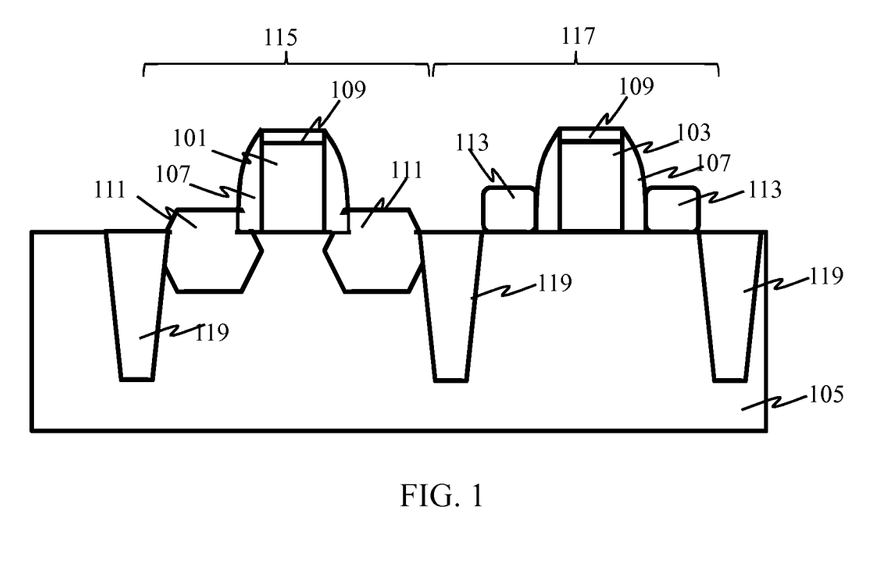
FIGS. 1 through 6 schematically illustrate a process flow for forming a trench silicide in accordance with an exemplary embodiment.

FIGS. 7 through 10 schematically illustrate a process flow for forming a trench silicide, in accordance with another exemplary embodiment. Adverting to FIG. 7, after the structure of FIG. 1 is formed, an ILD 701 is formed over the entire structure and planarized (e.g. by CMP) down to caps 109. Caps 109 are removed to open up the dummy gates. Then the dummy gates 101 and 103 are removed and replaced with HKMGs 703 and 705, respectively, by conventional processing. The HKMGs may include a high-k dielectric layer, one or more work function metals, and metal fill (not shown for illustrative convenience). Also, a dummy metal gate (not shown for illustrative convenience) is additionally formed over the STI region between eSiGe source/drain region 111 and raised source/drain region 113.

Figure 8:
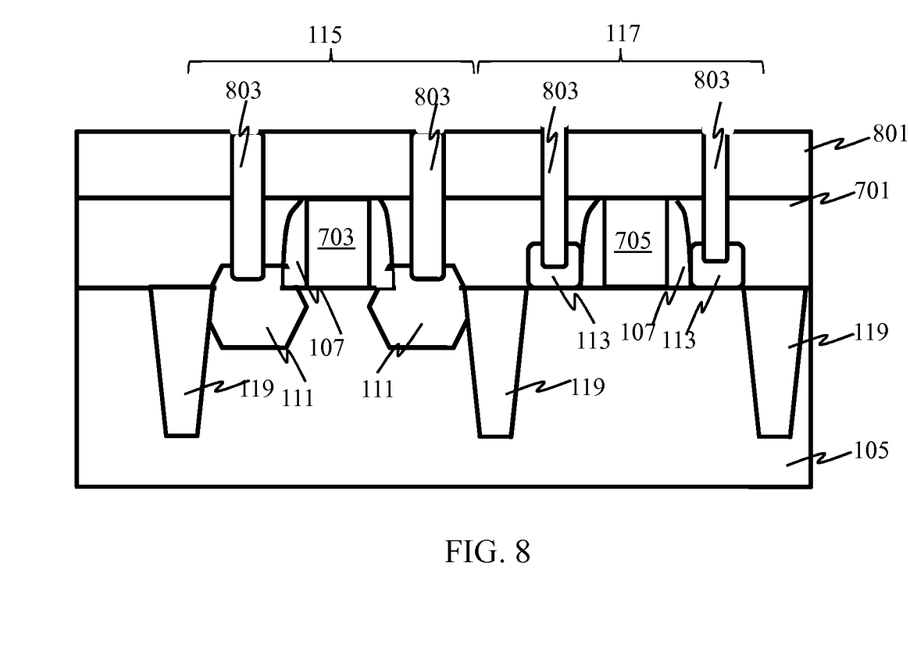
Figure 9:
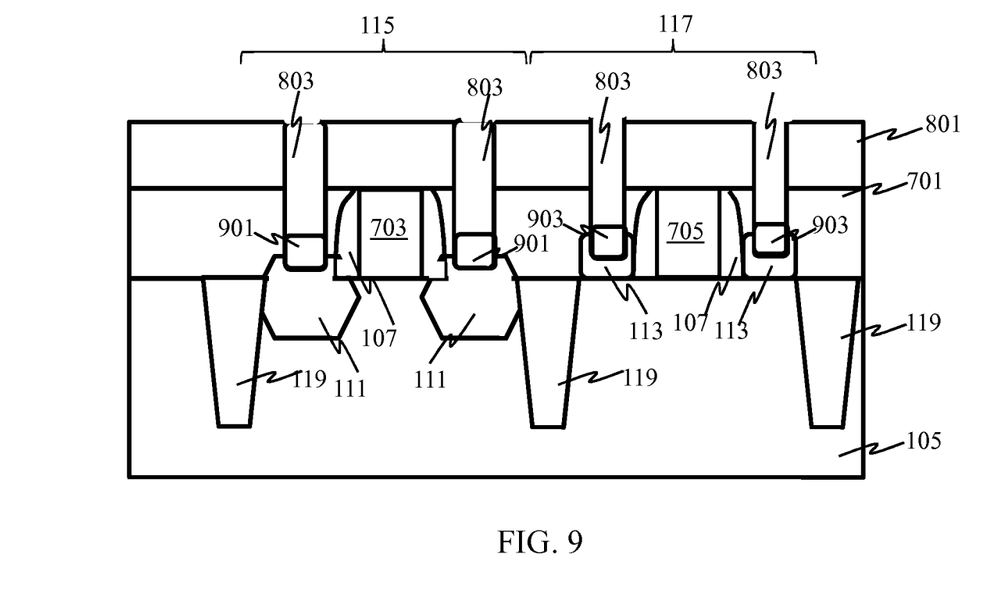

An additional ILD 801 is deposited over ILD 701, and contact trenches 803 are etched, for example by RIE, through ILD 801 and ILD 701, as illustrated in FIG. 8. The contact trenches 803 are over-etched into eSiGe source/drain regions 111 and raised source/drain regions 113, creating gouging. As illustrated in FIG. 9, extra silicon caps 901 and 903 are epitaxially grown in the contact trenches 803 on eSiGe source/drain regions 111 and raised source/drain regions 113, respectively. Extra silicon caps 901 and 903 are formed of an additional silicon material (the same material for both 901 and 903, grown at the same time). Extra silicon caps 901 and 903 are formed to the same thickness, for example a thickness of 1 to 20 nm.

Figure 10:
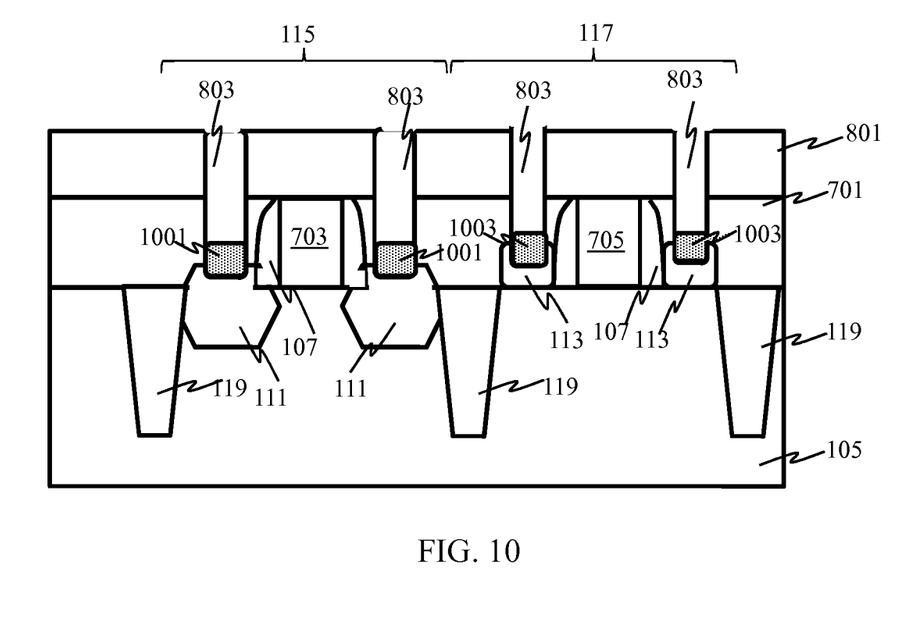

Adverting to FIG. 10, a metal, such as Ni, may then be deposited in contact trenches 803 and annealed to form a silicide 1001, and a silicide 1003, such as NiSi. The extra grown silicon caps 901 and 903 are consumed by the silicide process, serving as silicide material just at the silicide destination in a self-aligned mode. Therefore, NiSi piping into the source/drain junction region is eliminated. Subsequently, the contact trenches 503 are filled with contact material, such as W, and conventional BEOL processing continues (not shown for illustrative convenience).

The embodiments of the present disclosure can achieve several technical effects, including eliminating unwanted junction leakage and NiSi piping into the source/drain junction region. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for the 20 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming first and second dummy gates, each with spacers at opposite sides thereof, on a substrate;
   forming embedded silicon germanium (eSiGe) source/drain regions at opposite sides of the first dummy gate;
   forming raised source/drain regions at opposite sides of the second dummy gate;
   forming a silicon cap on each of the eSiGe and raised source/drain regions;
   forming an interlayer dielectric (ILD) over and between the first and second dummy gates;
   replacing the first and second dummy gates with first and second high-k/metal gates (HKMG), respectively;
   forming a contact trench through the ILD into the silicon cap over each of the eSiGe and raised source/drain regions; and
   forming a silicide over the eSiGe and raised source/drain regions.

2. The method according to claim 1, further comprising forming second spacers at opposite sides of each of the first and second dummy gates prior to forming the silicon cap.

3. The method according to claim 1, comprising forming the silicon caps by epitaxially growing silicon on the eSiGe and raised source/drain regions concurrently.

4. The method according to claim 1, comprising forming the contact trench by reactive ion etching (RIE).

5. The method according to claim 1, comprising forming the silicide from nickel and the silicon cap.

6. The method according to claim 1, wherein the first metal gate and eSiGe source/drain regions form a P-type field effect transistor (PFET), and the second metal gate and raised source/drain regions form an N-type field effect transistor (NFET).

7. The method according to claim 2, comprising forming the second spacers to a width of 1 to 20 nanometers (nm).

8. A method comprising:
   forming first and second dummy gates, each with spacers at opposite sides thereof, on a substrate;
   forming embedded silicon germanium (eSiGe) source/drain regions at opposite sides of the first dummy gate;
   forming raised source/drain regions at opposite sides of the second dummy gate;
   forming an interlayer dielectric (ILD) over and between the first and second dummy gates;
   replacing the first and second dummy gates with first and second high-k/metal gates (HKMG), respectively;
   forming a contact trench through the ILD into each of the eSiGe and raised source/drain regions;
   forming a silicon cap on each of the eSiGe and raised source/drain regions;
   and forming a silicide over the eSiGe and raised source/drain regions.

9. The method according to claim 8, comprising forming the silicon caps by epitaxially growing silicon on the eSiGe and raised source/drain regions concurrently.

10. The method according to claim 8, comprising forming the contact trench by reactive ion etching (RIE).

11. The method according to claim 8, comprising forming the silicide from nickel and the silicon cap.

12. The method according to claim 8, wherein the first metal gate and eSiGe source/drain regions form a P-type field effect transistor (PFET), and the second metal gate and raised source/drain regions form an N-type field effect transistor (NFET).

13. A device comprising:
   first and second high-k/metal gates (HKMG), each with spacers at opposite sides thereof, on a substrate;
   embedded silicon germanium (eSiGe) source/drain regions at opposite sides of the first HKMG;
   raised source/drain regions at opposite sides of the second HKMG;
   a silicon cap on each of the eSiGe and raised source/drain regions;
   an interlayer dielectric (ILD) over and between the first and second HKMGs;
   a contact trench through the ILD into the silicon cap over each of the eSiGe and raised source/drain regions;
   second spacers on the eSiGe and raised source/drain regions, between the first spacers and the silicon caps; and
   a trench silicide over the eSiGe and raised source/drain regions.

14. The device according to claim 13, wherein the second spacers have a width of 1 to 20 nanometers (nm).

15. The device according to claim 13, wherein the silicon caps are formed of silicon epitaxially grown to a thickness of 1 to 20 nm.

16. The device according to claim 13, wherein the trench silicide comprises nickel silicide (NiSi), formed with the silicon of the silicon caps.

17. The device according to claim 13, wherein the first metal gate and the eSiGe source/drain regions form a P-type field effect transistor (PFET), and the second metal gate and raised source/drain regions form an N-type field effect transistor (NFET).

18. The device according to claim 13, further comprising shallow trench isolation (STI) regions between the eSiGe and raised source/drain regions.

\* \* \* \* \*